(12) United States Patent
Cheng et al.

(10) Patent No.: US 10,191,521 B2
(45) Date of Patent: Jan. 29, 2019

(54) HUB-LINK LIQUID COOLING SYSTEM

(71) Applicant: Coolanyp, LLC, Kirkland, WA (US)

(72) Inventors: Peng Cheng, Redmond, WA (US); Dai Ying Wu, Kirkland, WA (US)

(73) Assignee: Coolanyp, LLC, Kirkland, WA (US)

( * ) Notice: Subject to any disclaimer, the term of this patent is extended or adjusted under 35 U.S.C. 154(b) by 0 days.

(21) Appl. No.: 15/605,693

(22) Filed: May 25, 2017

(65) Prior Publication Data
US 2018/0341298 A1 Nov. 29, 2018

(51) Int. Cl.
G06F 1/20 (2006.01)
H05K 7/20 (2006.01)

(52) U.S. Cl.
CPC ............ *G06F 1/20* (2013.01); *H05K 7/20318* (2013.01); *H05K 7/20327* (2013.01); *H05K 7/20818* (2013.01)

(58) Field of Classification Search
CPC ...... G06F 1/20; G06F 2200/201; G06F 1/206; H05K 7/20318; H05K 7/20327; H05K 7/20818; H05K 7/20254; F28D 15/00; F28D 15/02; F28D 2021/0028; F28D 15/04; F28D 2021/0031; F28D 15/0266; F28D 15/043; F28D 2015/0225; F28F 2210/02
USPC ......... 165/185, 80.4, 101, 104.21, 174, 272, 165/104.26, 46; 361/699, 689, 700, 361/679.53, 688, 696, 698, 697
See application file for complete search history.

(56) References Cited

U.S. PATENT DOCUMENTS

| | | | |
|---|---|---|---|
| 7,768,783 B1 | 8/2010 | Kajiya et al. | |
| 9,109,846 B2* | 8/2015 | Chen | C08J 5/18 |
| 2007/0227709 A1* | 10/2007 | Upadhya | G06F 1/20 165/121 |
| 2007/0256814 A1* | 11/2007 | Moon | H01L 23/427 165/80.4 |
| 2008/0285224 A1* | 11/2008 | Odanaka | G06F 1/20 361/679.48 |
| 2009/0277616 A1* | 11/2009 | Cipolla | F28D 15/0233 165/104.33 |
| 2011/0036538 A1* | 2/2011 | Brunschwiler | G06F 1/20 165/11.1 |

(Continued)

FOREIGN PATENT DOCUMENTS

| | | |
|---|---|---|
| JP | 2006245114 | 9/2006 |
| JP | 2013065227 | 4/2013 |
| WO | WO2016209496 | 12/2016 |

OTHER PUBLICATIONS

PCT Search Report and Written Opinion dated Aug. 9, 2018, for PCT Application No. PCT/US18/28647, 13 pages.

*Primary Examiner* — Mandeep S Buttar
(74) *Attorney, Agent, or Firm* — Lee & Hayes, P.C.

(57) ABSTRACT

A cooling system for computer systems includes one or more cooling hubs and one or more heat spreading devices. The heat spreading devices have nodes and paths defining inner pathways that enclose a two-phase working fluid. The nodes and paths network acts as links for the two-phase working fluid to absorb and transfer thermal energy from the heat-generating components of the electronic device to the cooling hub. The hub-link structure decouples the direct geometrical relationship between heating components and cooling sources to enable a higher degree of design freedom, space management, and cooling redundancy.

19 Claims, 16 Drawing Sheets

(56) References Cited

U.S. PATENT DOCUMENTS

| | | | |
|---|---|---|---|
| 2011/0303394 A1* | 12/2011 | Branton | H05K 7/20754 165/104.33 |
| 2014/0043765 A1* | 2/2014 | Gohara | H01L 23/3735 361/699 |
| 2014/0321050 A1 | 10/2014 | Sato et al. | |
| 2015/0000864 A1* | 1/2015 | Kobayashi | H05K 7/20636 165/46 |

* cited by examiner

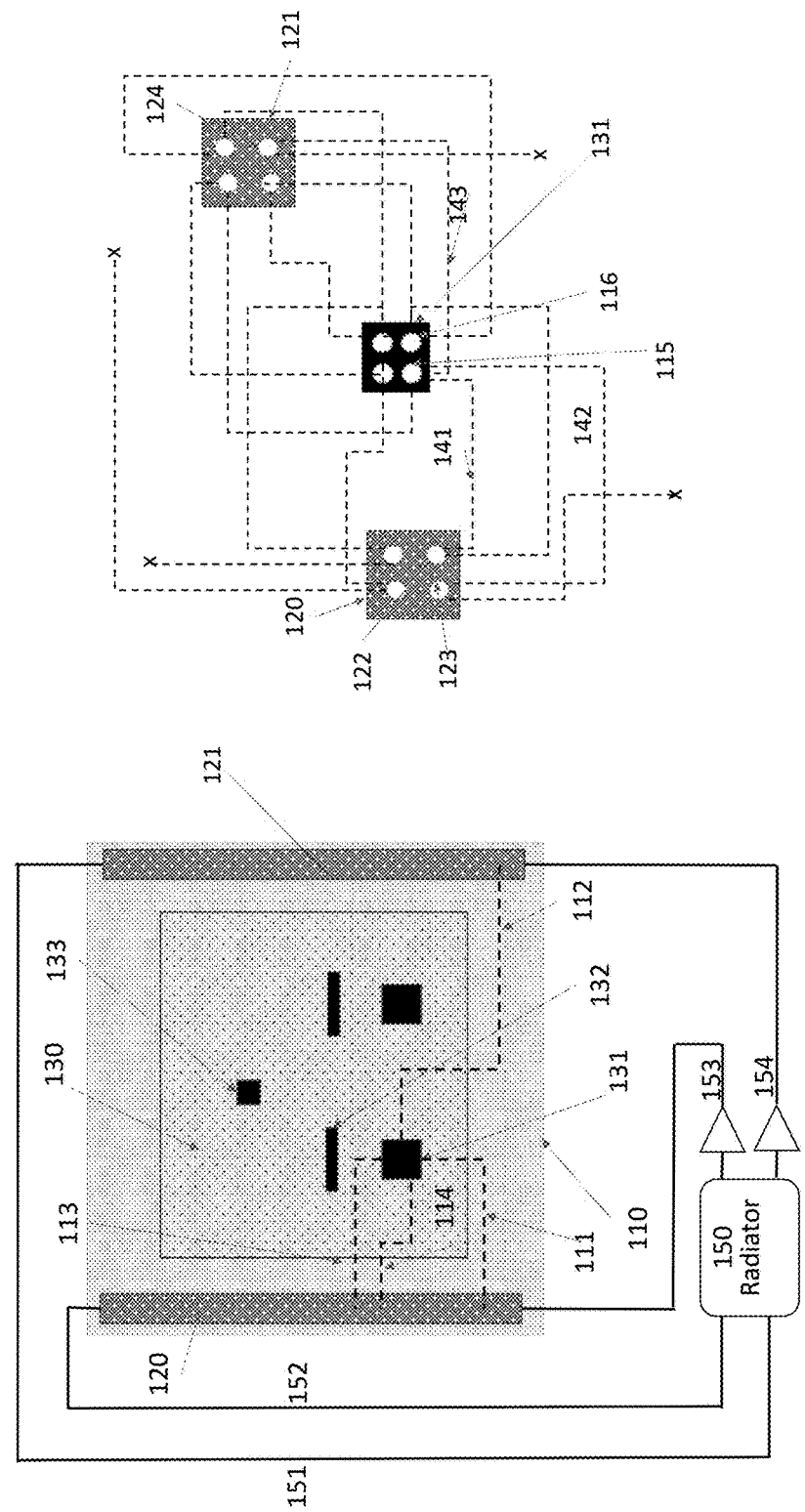

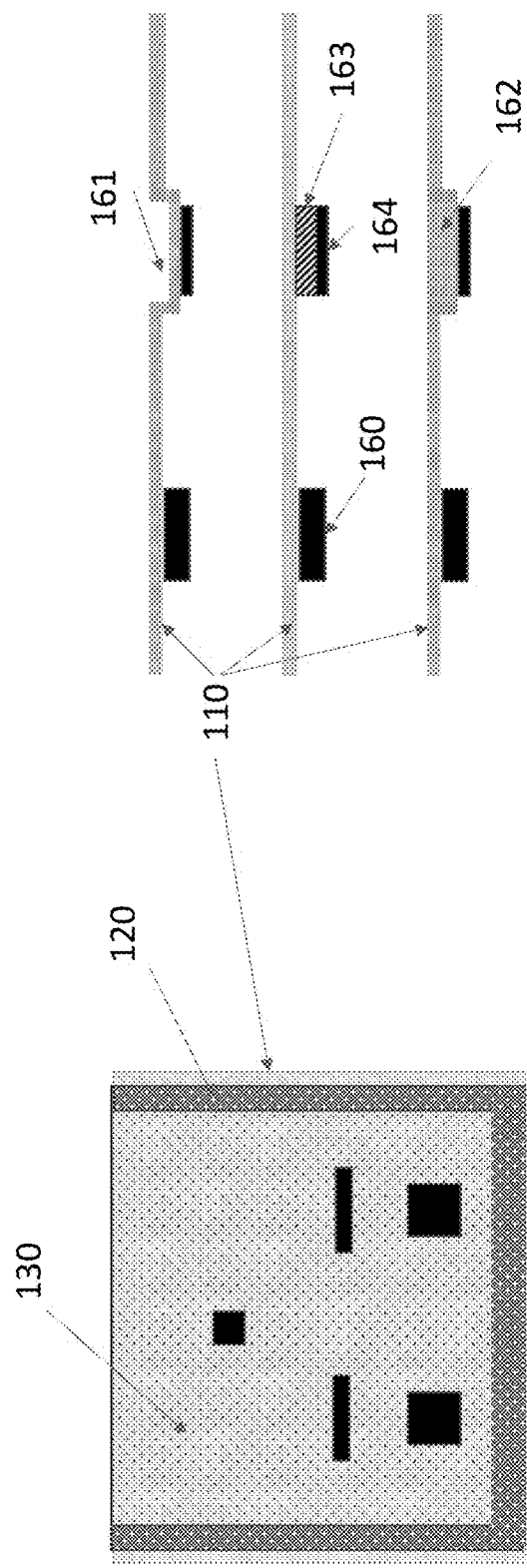

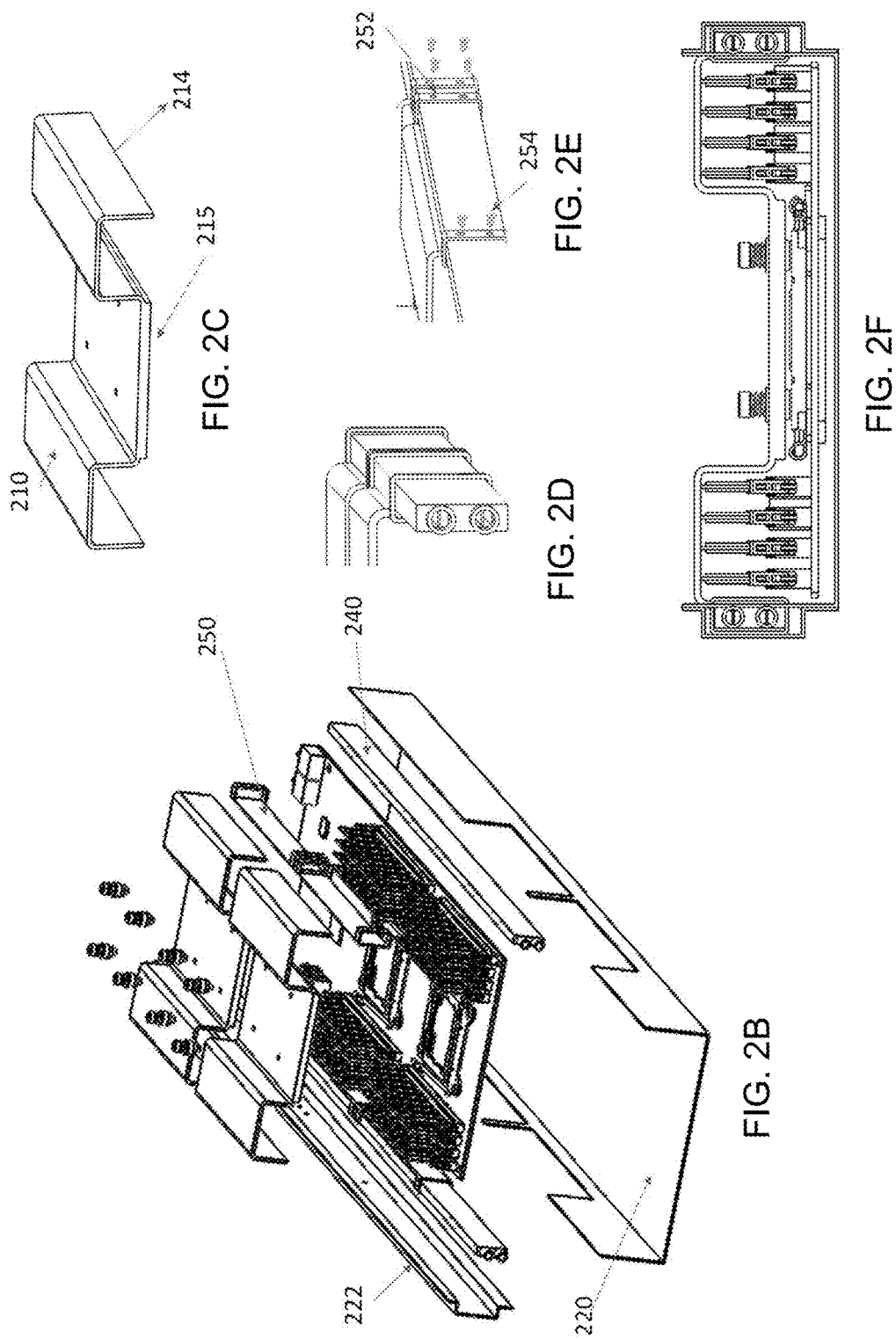

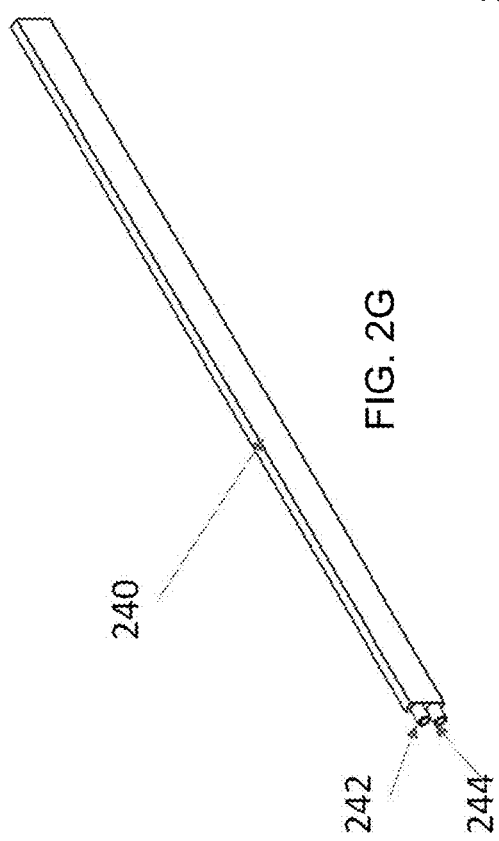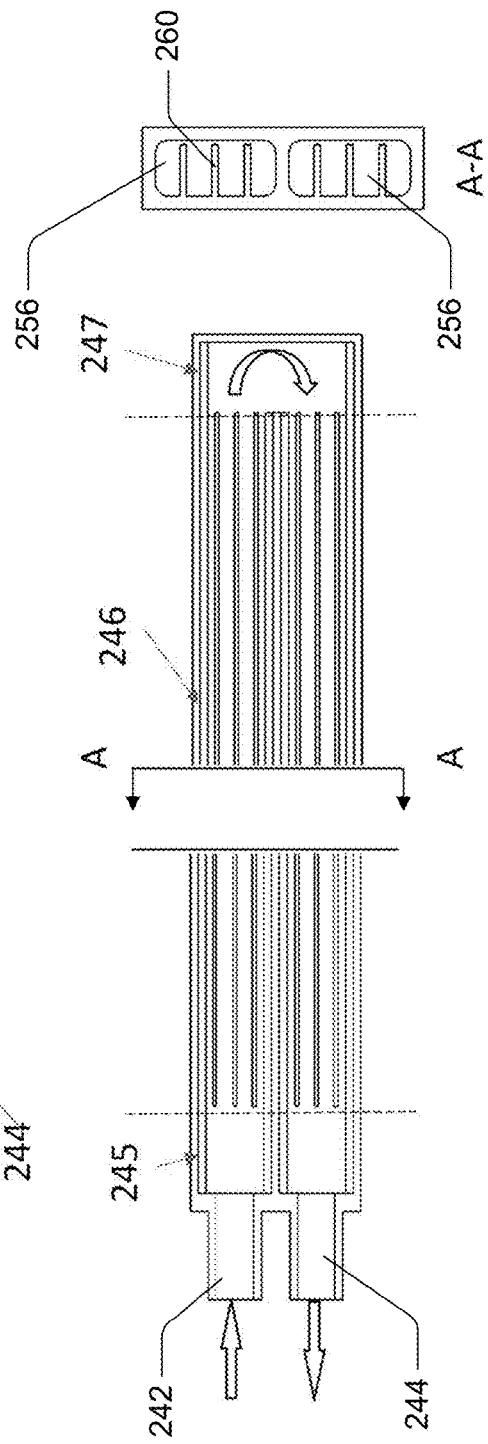

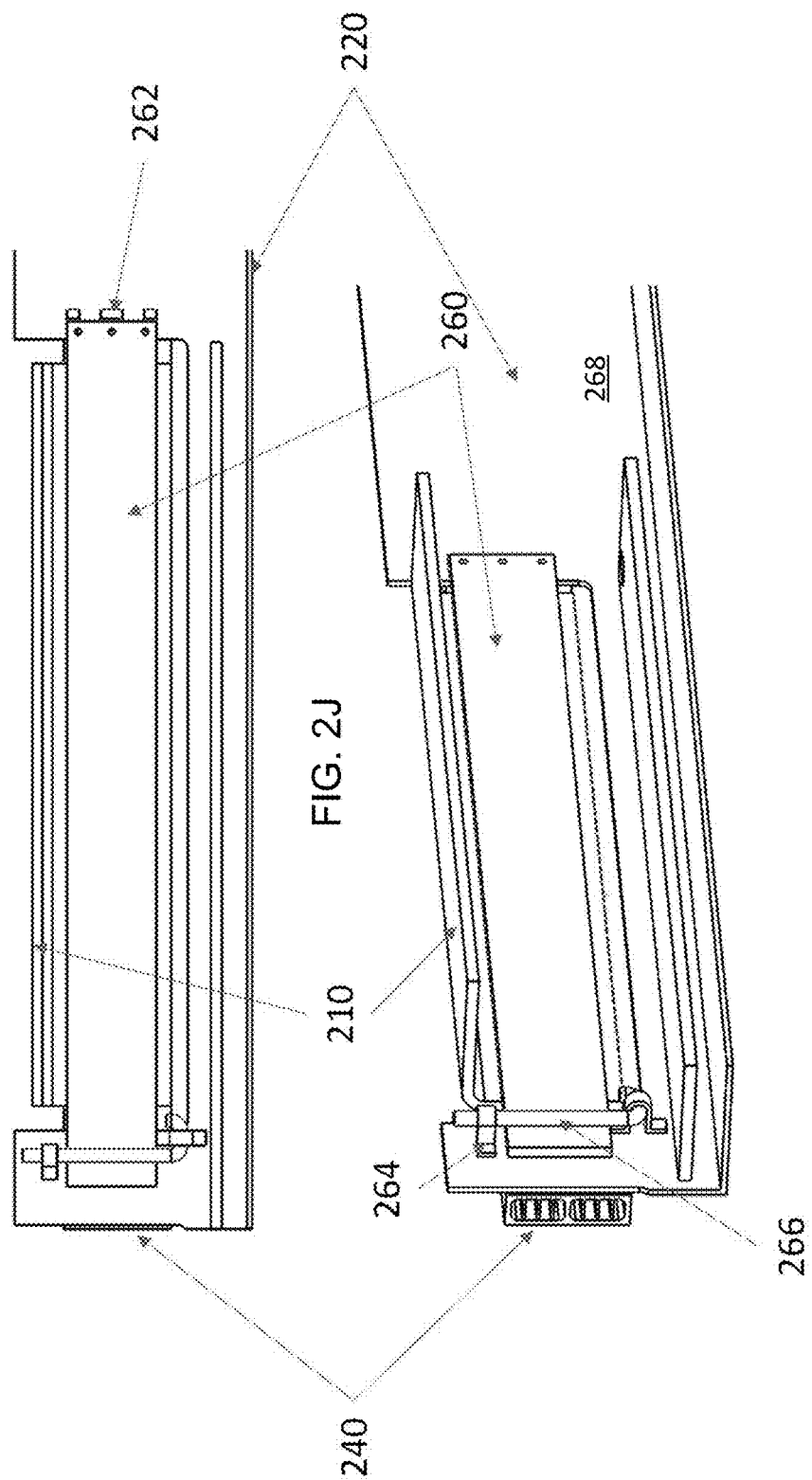

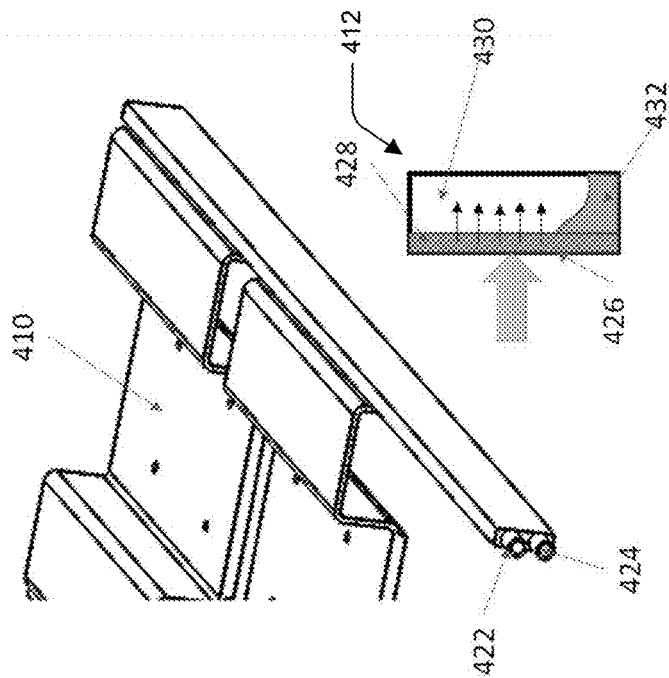
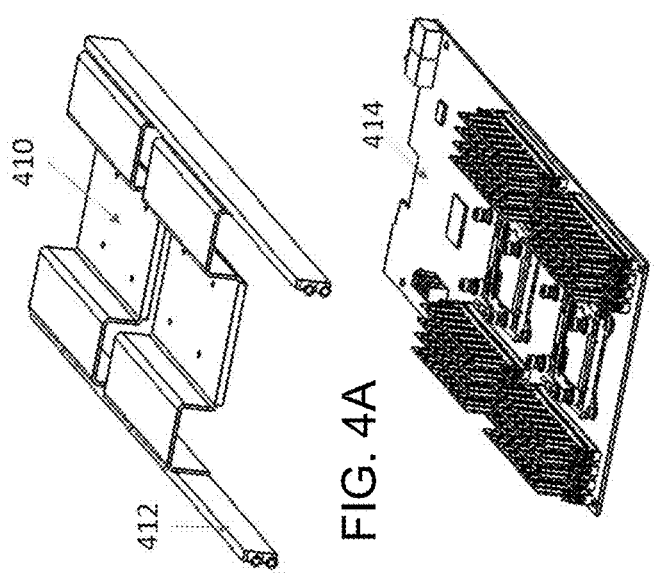

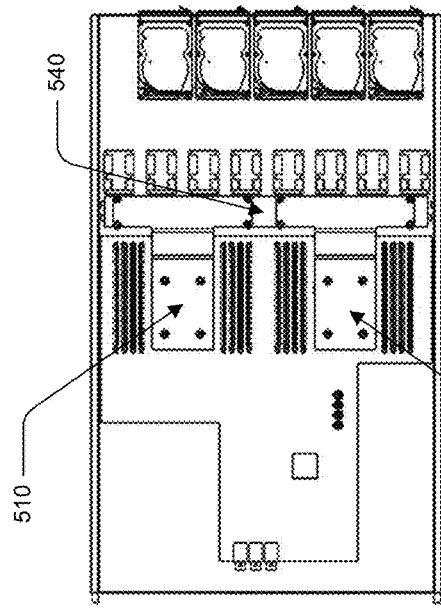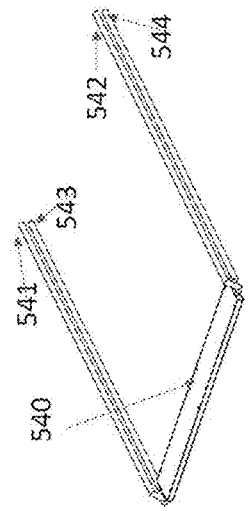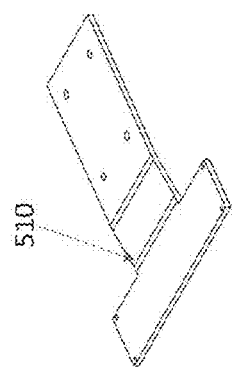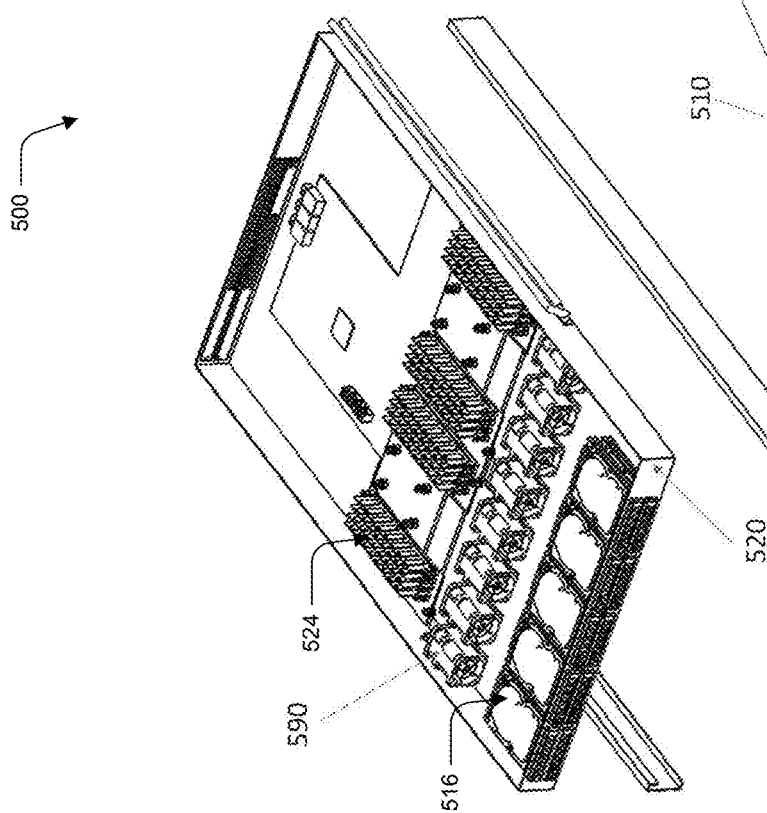
FIG. 5C
FIG. 5D
FIG. 5B
FIG. 5A

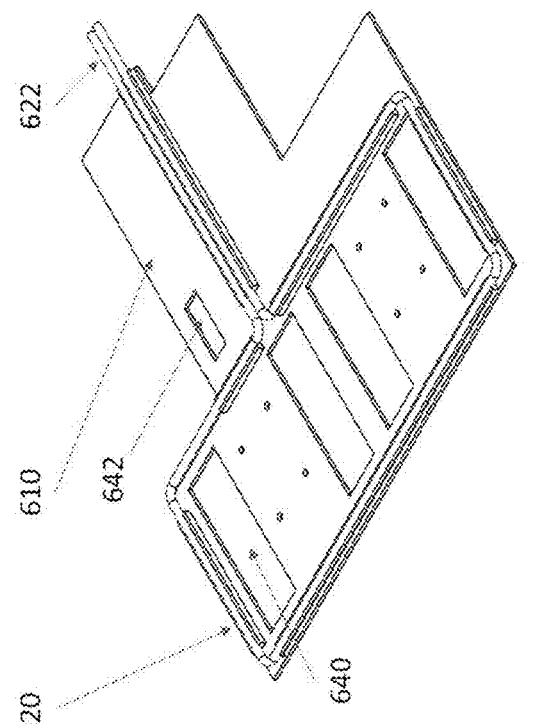
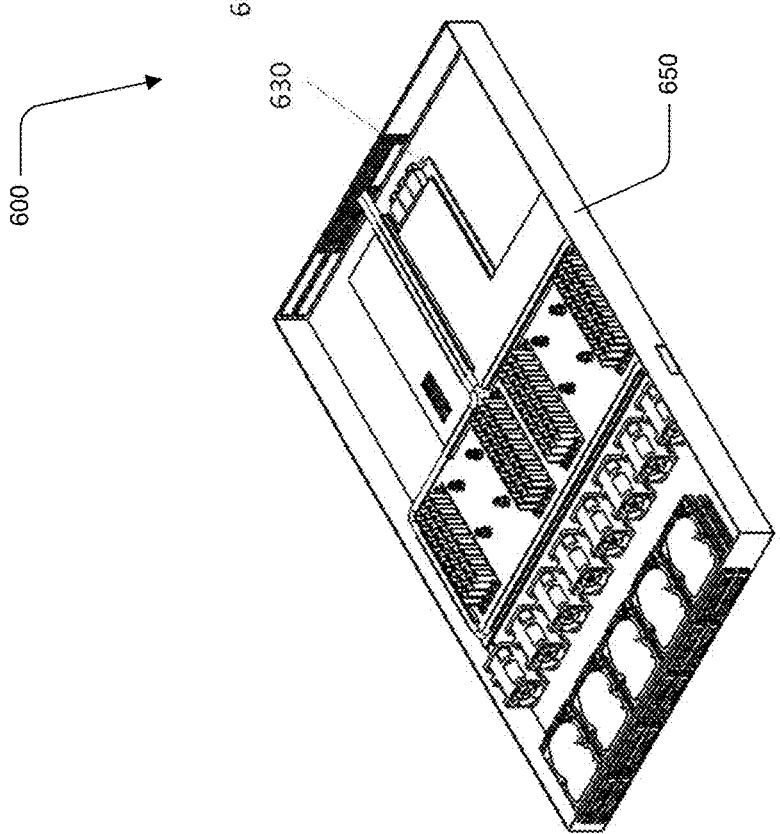
FIG. 6B
FIG. 6A

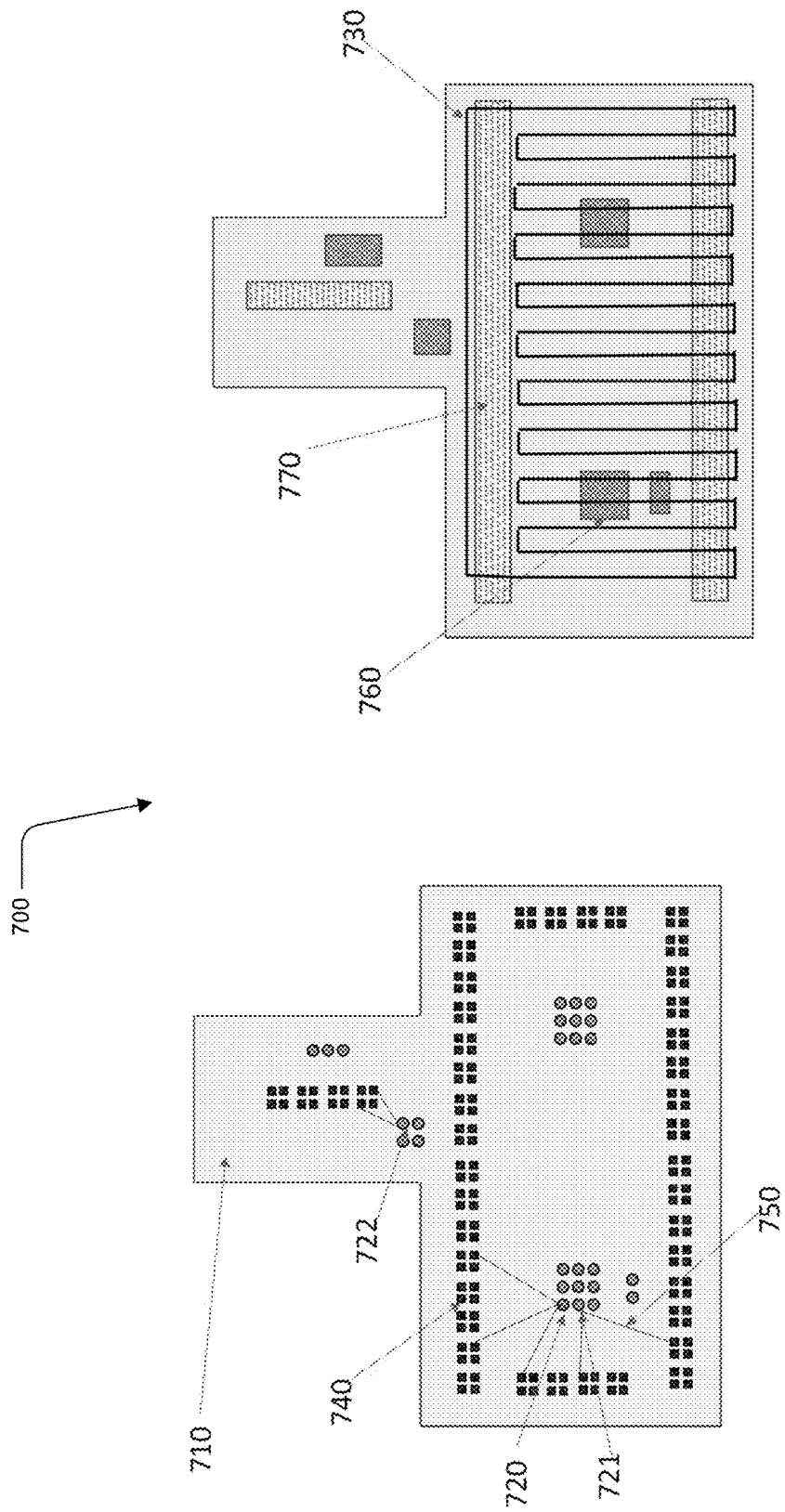

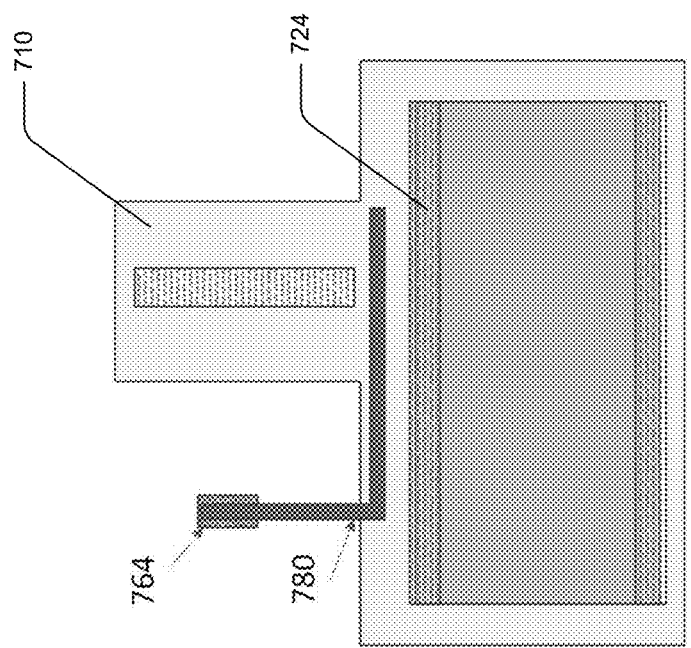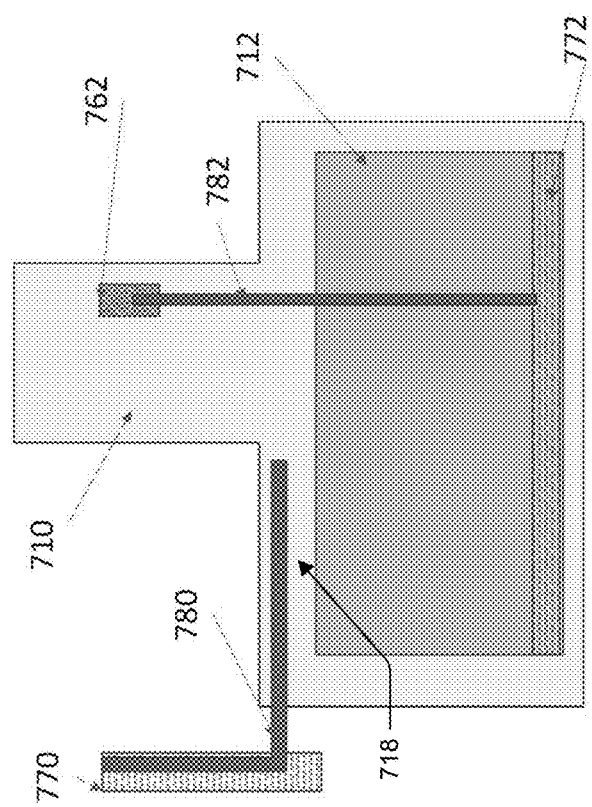

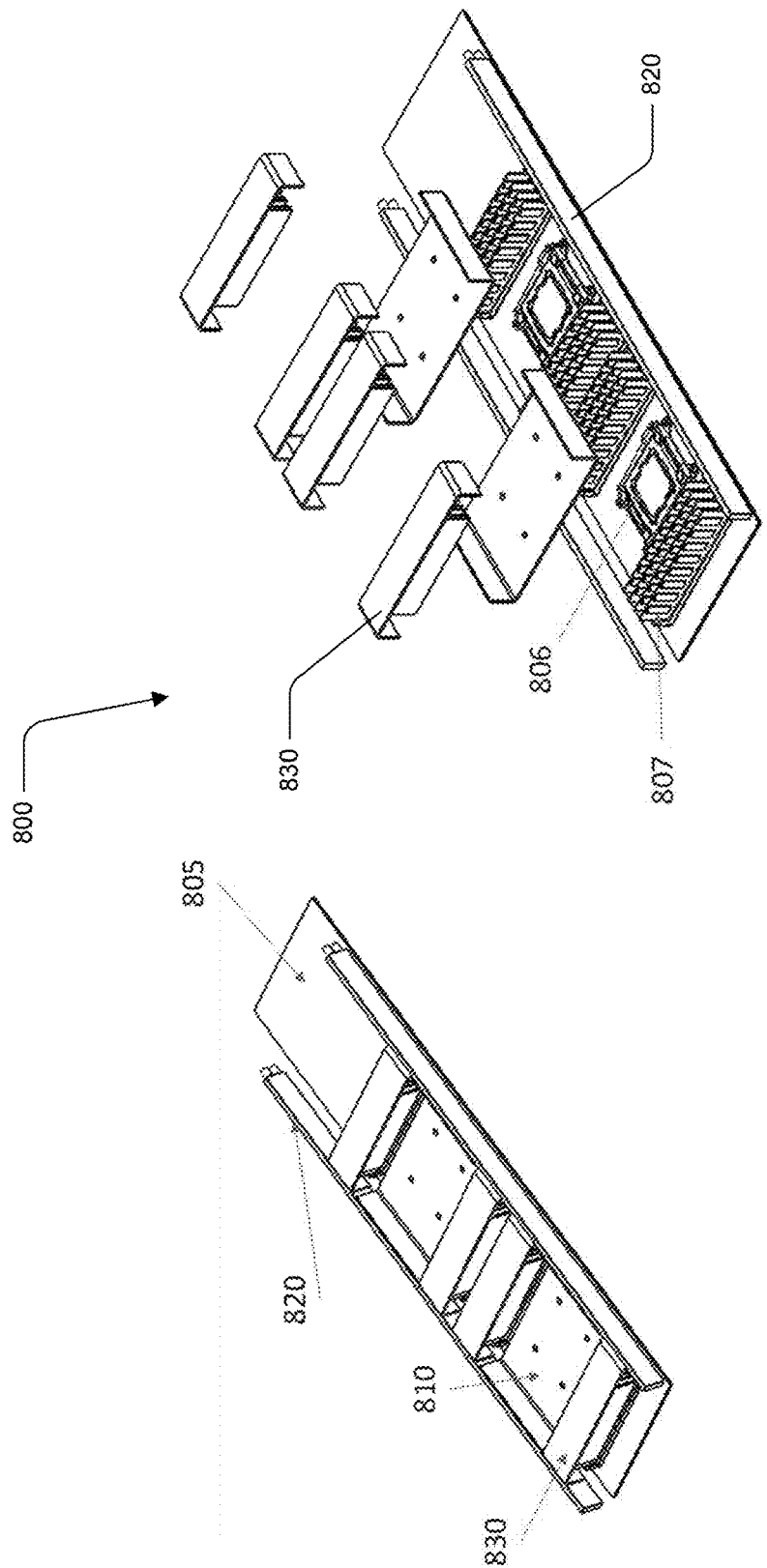

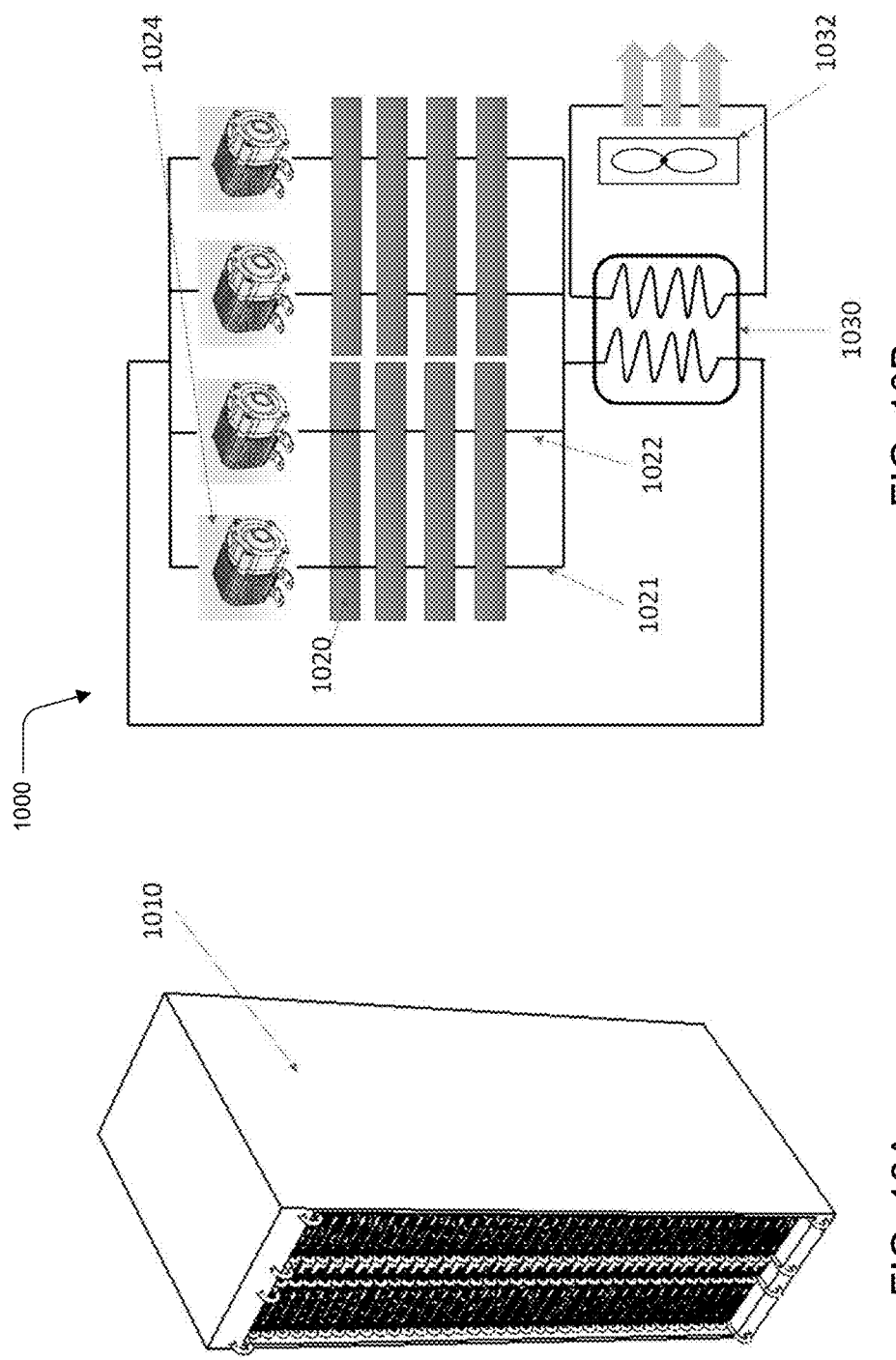

HUB-LINK LIQUID COOLING SYSTEM

BACKGROUND

Computer systems generate heat from operating components including central processing units, graphical processing units, memories, storage devices, and other components used in the operation of a computer system. In many data centers, arrays of computer servers are hosted in an enclosed environment. Thermal management solutions are aimed at collecting and dissipating the generated heat to the exterior of the data center. However, typical thermal management solutions are complex and highly inefficient systems. Traditional technologies implement air cooling for the thermal management, but it is often insufficient to meet the power demand on the component level and it is also expensive for a data center's daily operation in terms of electricity costs and water resources being consumed. In recent years, liquid cooling systems, which utilize liquid as a cooling medium, have gradually been adopted due to its higher heat transfer efficiency and lower energy consumption than air-cooled systems. However, considerations with liquid cooling systems, such as safety, reliability, and maintainability, challenge the implementation of liquid-based cooling solutions, especially in hyper-scale data centers.

BRIEF DESCRIPTION OF THE DRAWINGS

The detailed description is described with reference to the accompanying figures. The same reference numbers in different figures indicate similar or identical items throughout.

FIG. 1A illustrates a schematic structure of a hub-link liquid cooling system.

FIG. 1B illustrates a schematic structure of a hub-link cooling system showing the micro-channels forming a node-path network between heat absorption and dissipation zones.

FIG. 1C illustrates a schematic plan view structure of a hub-link liquid cooling system with the hub inside a computer system.

FIG. 1D illustrates a schematic elevation view structure of a hub-link liquid cooling system with the hub inside a computer system.

FIG. 2B illustrates an exploded perspective view of a hub-link cooling system and a 1U form factor computer.

FIG. 2C illustrates a perspective view of a heat spreading apparatus.

FIGS. 2D and 2E illustrated one embodiment of a cooling hub and its attachment mechanism.

FIG. 2F is an end view illustrating the heat spreading apparatus attached to an electronic device.

FIGS. 2G-2I illustrate one embodiment of cooling hub.

FIGS. 2J and 2K illustrate one embodiment of an attachment method between a self-organized thermodynamic system ("SOTS") heat spreading apparatus and a cooling hub.

FIGS. 4A and 4B are perspective illustrations of another embodiment of a hub-link liquid cooling system with cooling hubs and SOTS heat spreading apparatuses integrated as a single piece.

FIG. 4C is a perspective partial view of a hub-link liquid cooling system utilizing two-phase fluid as a cooling medium.

FIG. 4D is a schematic representation of a cross section of the cooling hub from FIG. 4C.

FIG. 5A is a perspective view of a hub-link hybrid cooling system using both fluid and air as a coolant medium as installed into an electronic device.

FIG. 5B is a perspective view of a heat spreading apparatus.

FIG. 5C is a plan view of the hub-link hybrid cooling system of FIG. 5A.

FIG. 5D is a perspective view of a cooling hub.

FIG. 6A is a perspective view of a hub-link liquid cooling system in conjunction with a single SOTS heat spreading apparatus.

FIG. 6B is a perspective view of the hub-link liquid cooling system separate from an electronic device.

FIG. 7A is a plan view of the structure of the SOTS illustrating the relationships between cooling hubs and computer components.

FIG. 7B is a plan view of a heat spreading apparatus with oscillating heat pipes.

FIG. 7C is a plan view illustrating indirect contact between a heat spreading apparatus and a cooling hub.

FIG. 7D illustrates a hub-link liquid cooling system with alternate heat spreading devices.

FIG. 8A is a perspective view of a computer system with component placement configured for a hub-link cooling system.

FIG. 8B is an exploded perspective view of the computer system of FIG. 8A.

FIGS. 10A and 10B are schematic drawings of cooling redundancy for a clustered computer system.

DETAILED DESCRIPTION

Figure 2A:
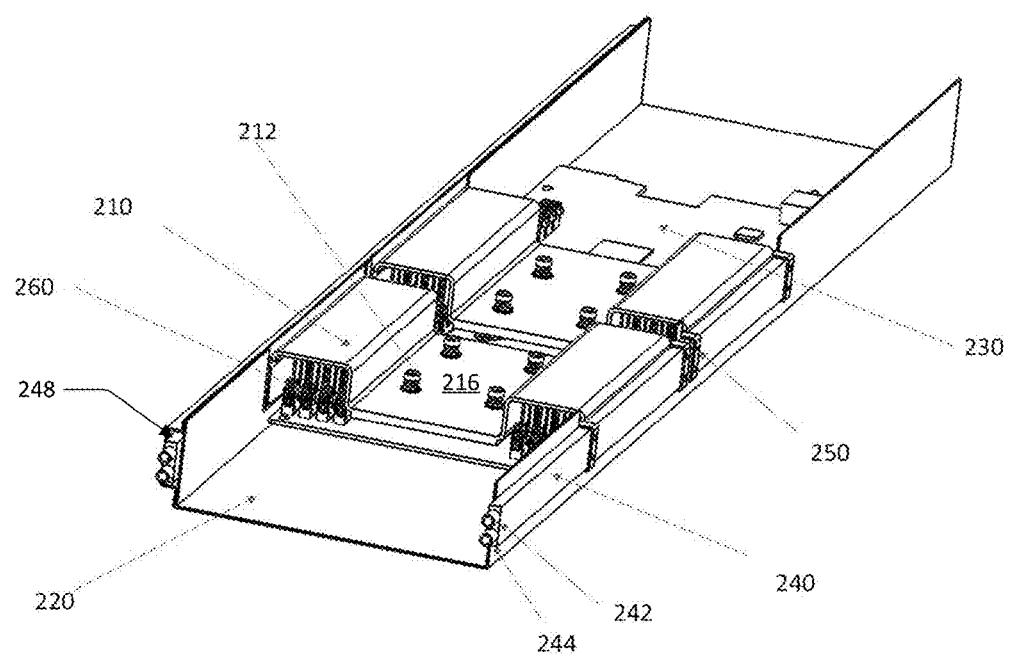
FIG. 2A is an illustration of a hub-link liquid cooling system as installed within a 1U form factor computer.

The generation of heat within a computer system, if not appropriately managed, can lead to reduced component lifespan, permanent component damage, or data loss. Typical thermal management solutions drive cooling medium (air, liquid or both in hybrid system) into an enclosure hosting the computer systems where it exchanges heat with computer components locally and then is led out of system for the next stage of heat exchange to dissipate heat to the data center exterior. In other words, the cooling unit shares space with the computer system in the same housing enclosure, which is generally the root cause of insufficient cooling due to the interference of component placement and cooling medium passages. To free up some system-internal volume, some attempts have introduced cold plates or thermosyphons that house and circulate liquid or other cooling media to computer components for direct heat transfer. However, the complicated layouts of the flow path across multiple components still occupy a great amount of system-internal volume. Additionally, the connections among housing units to form enclosed liquid loops raise significant concerns of possible leakage due to constant positive internal pressure and corrosion over time, which can cause critical damage to the computer servers.

Other attempts have relied upon submerging computer systems or even whole server rack into a dielectric liquid medium to avoid complicated flow-path layouts and coolant-leakage damage, but there are some other concerns such as material compatibility and operation/maintenance difficulties.

Still other attempts utilize heat spreading devices such as heat pipes or solid conductive materials to transfer heat from computer components to cooling members placed outside the computer enclosure. These heat pipe based spreading devices still take up a lot of space since a large number of pipes are grouped and bent to connect the computer components to the cooling units. Heat pipe's heat transfer capability is limited by capillary force from the inner wall wick and decreases with heat pipe's diameter, length, and placement angle to gravity (90° to −90°). In addition to the limited heat transfer capability, heat pipe's tubular geometry generally requires planar housing units to adapt to planar computer components and cooling medium's housing units, which will introduce more undesirable layers of contact thermal resistance and significantly constrain the overall cooling performance.

According to some embodiments described herein, a compact and comprehensive liquid cooling system is provided, that in many cases, is highly efficient in heat transfer and energy usage. Additionally, a mechanical architecture of the liquid cooling system accommodates the layout complexity of a computer system with multiple heat generating components and peripheral equipment. A liquid cooling arrangement may provide cooling redundancy which may be easily implemented to individual components in a single computer system or distributed across clustered systems of a larger computing data center without introducing structural complexity or equipment duplication.

To this end, a hub-link cooling system may be provided for a computer system that includes one or more heat generating components. The hub-link cooling system may include at least one cooling hub and a multitude of heat flow links. The heat flow links may be hosted in at least one heat spreading apparatus that includes a plurality of capillary micro-channels working as paths to direct the internal two-phase working fluid flow and a plurality of joints connecting the micro-channels, which are referred to as nodes. The nodes may be defined within a heat absorption or a heat dissipation zone where two or more micro-channels interconnect. The heat spreading apparatus may be placed between computer components and cooling hubs, which includes a housing body and a Self-Organized Thermodynamic System ("SOTS") disposed within the housing body, such as is described in U.S. patent application Ser. No. 15/060,426, the entirety of which is incorporated herein by reference in its entirety. The cooling hub may contain a liquid cooling medium that dissipates heat collected from the computer components via SOTS. The cooling hub may have one inlet and one outlet to circulate the liquid cooling medium.

A two-phase fluid may be enclosed within the capillary micro-channels working as a thermal energy carrier. The two-phase working fluid may flow inside the SOTS micro-channel network, which has nodes adjacent to computer components and cooling hubs, to provide heat flow links between computer components and the cooling hub. The two-phase working fluid may absorb heat from the computer components as it flows through nodes adjacent to the computer components, flow along the path defined by the micro-channels, and dissipate heat at the nodes adjacent to the cooling hub where additional liquid cooling medium in the cooling hub collects and dissipates the heat away. The additional liquid cooling medium in the cooling hub may be a single or bi-phase cooling fluid which is maintained separately from the two-phase working fluid within the SOTS micro-channel.

The heat from the computer components to the SOTS, and from the SOTS to the cooling hub, can be transferred by conduction. The two-phase working fluid within the SOTS absorbs and dissipates heat at nodes by conduction, convection, phase change, or any combination thereof, where the heat transfer regime is determined by the transient local conditions. A heat radiating device in line with the hub may remotely dissipate the heat collected by liquid cooling medium. A pump system may circulate liquid cooling medium between the cooling hub and the heat radiating components and distribute liquid cooling medium among multiple cooling hubs.

In some embodiments, thermodynamic systems, apparatuses, and methods are configured to dissipate thermal energy from a heat-generating component within an electronic device to one or more thermal energy dissipation zones through a closed fluid circuit enclosing a two-phase fluid. As used herein, an electronic device may include any type of electronic device. By way of example, desktop computers, laptop computers, servers, gaming consoles, tablet computers, set-top boxes, televisions, displays, hand-held devices, media players, and other such devices that may generate internal heat during use are all examples of electronic devices. Embodiments described herein enable highly efficient heat transfer from a plurality of thermal energy absorption nodes to a plurality of thermal energy dissipation nodes in a self-organized manner based on local conditions (e.g. temperature, pressure, two-phase liquid state, etc.). Some embodiments ensure the thermodynamic system to be critically self-organized via fractioning absorption and dissipation zones into multiple subzones represented by nodes interconnected by a network of capillary channels to enable both mass and energy communications. For example, a plurality of nodes may be fractioned from the other nodes in the same zone, that is, the nodes within a zone are not connected to each other.

In the SOTS, the two-phase working fluid changes phase state, such as from liquid to vapor, frequently but randomly, which causes "jumps" of mass transfer within the capillary channels due to a significant volume change. Self-organized criticality stands for a state for the whole fluid flow inside SOTS network reaching a scale-invariant point, accompanied with appropriate layout of micro-channels and connectivity topology to spread random "jumps" across the network. This mass transfer, which may also be referred to as capillary action, within the closed fluid-circuit, nearly eliminates gravitational effects with respect to mass flow of the two-phase working fluid between nodes. Further objects and advantages of the presently disclosed systems, apparatuses, and methods are discussed throughout the disclosure.

In some embodiments, the SOTS heat spreading apparatus aligns a plurality of node-path networks to an individual heat generating component of a computer system, which provides heat flow links from the heat generating component to one or multiple cooling hubs. A link comprises a node adjacent to a computer component, a node adjacent to a cooling hub, and a thermal communication path connecting these two nodes. A first two-phase working fluid carrier absorbs a fraction of heat from the computer component and moves to and dissipates the heat at a cooling hub. A second two-phase working fluid carrier will refill the void at the node adjacent to the computer component to continuously absorb and transfer the heat. The moving and backfilling of the two-phase working fluid carriers are driven by the pressure differences among nodes which are determined by local conditions including temperature, phase mode, and heat intensity. The topology of the node-path network accompanying with the heating-cooling layouts is intended to provide a global heat and mass flow inside the SOTS apparatus with self-organized criticality.

By utilizing a plurality of heat flow links provided by SOTS heat spreading apparatus, the liquid cooling medium and its housing unit can be placed outside the computer system or inside the computer system with minimal internal space occupancy.

In one embodiment, the SOTS heat spreading apparatus is formed as a solid body that integrates a plurality of micro-channels into the solid body. In some cases, the minimal thickness of the body can be as small as about 1 mm in some situations. The SOTS, with its micro-channels, transfers heat laterally away from the heat source. The SOTS may be configured to occupy a small fraction of the internal space of the computer system (e.g., the SOTS may occupy 1 mm out of 44.5 mm in height for 1U form factor). The SOTS heat spreading apparatus can be conformingly attached to multiple computer components at different heights by integrating the micro-channels in three dimensions.

In one embodiment, a single heat spreading apparatus may be a generally planar solid body that attaches to multiple cooling hubs. For example, a single SOTS may be connected to N hubs which may be expressed by the relationship "1:N." In many cases, a cooling hub has one inlet and one outlet for the liquid cooling medium. The cooling hub may have multiple contact zones to one or more SOTS cooling apparatuses in a single computer system, or the cooling hub may have multiple separated sections interconnected in series or in parallel in a single computer system. In this implementation where a single hub may be connected to one or more SOTS, it may still be considered a single hub. Multiple or "M" numbers of computer components can be in thermal contact with a single SOTS heat spreading apparatus, and hereby the relationship may be denoted as M:1. By linking "M" computer components to "N" cooling hubs with a single heat spreading apparatus, a relationship between computer components and cooling hubs may be denoted by the relationship "M:N," which can be interpreted as: one of "M" components is cooled by "N" cooling hubs, and one of "N" cooling hubs cools "M" components. In this way, the described system may provide "N-folds" redundancy for each individual component, and "M" pieces of redundantly cooled components need only "N" units of cooling hubs, instead of "M×N" units.

The liquid cooling medium through the hubs is driven by a pump system, which circulates the liquid cooling medium through the cooling hub(s) to collect the heat generated by computer system component(s) and transferred from the computer system components to the liquid cooling medium via SOTS heat spreading apparatus, and then circulates to a radiating device to dissipate the heat, which forms a closed loop flow path. In some cases, a cooling hub will define a closed fluid loop with cooling fluid circulating through the closed loop between areas of heat absorption and areas of heat dissipation.

In some embodiments, a clustered system hosts "L" numbers of computer systems of similar physical configurations. Each computer system may have "M" components cooled by "N" cooling hubs, i.e. "M:N". The first cooling hubs of the "L" computer systems may be connected in series to form a first cooling loop, and so do the second, the third, and all the way to the "Nth" cooling hub. In this way, "N" cooling hubs in a system are in "N" cooling loops. The relationship between the components of the clustered system and cooling loops can be expressed as "L×M:N", which can be interpreted as: one of "L×M" components is cooled by "N" cooling loops, and one of "N" cooling loops cools "L×M" components. This arrangement provides "N-folds" redundancy for each individual component, and "L×M" redundantly-cooled components need only "N" units of cooling loops, as opposed to requiring "L×M×N" units. This will be shown and described in further detail herein below.

In some embodiments, each individual cooling loop has one pump system to support the circulation of liquid cooling medium. Therefore, the components in a single computer system can achieve pump redundancy of "M:N", or in a clustered system for pump redundancy of "L×M:N".

In other embodiments, individual cooling loops are grouped in parallel and connected to a manifold which utilizes "K" redundant pumps to distribute and collect liquid cooling medium among cooling loops. Through such an arrangement, the components in a single computer system can achieve pump redundancy of "M:K" in addition to "M:N" cooling loop redundancy, or in a clustered system for pump redundancy of "L×M:K" in addition to "L×M:N" cooling loop redundancy.

The advantages described herein may also be obtained by utilizing a hybrid cooling system. For example, the major heat generating sources may be cooled by a hub-link cooling system, as described herein, and the non-critical components (e.g., insulated-gate bipolar transistors, voltage regulators, etc.) and peripheral internal equipment (e.g., power supplies, storage devices, add-on cards, etc.) may be air-cooled by fans since they generate minor amounts of heat during operation as compared with the major heat generating sources (e.g., CPU, GPU, etc.).

The hub-link cooling system may utilize the phase change of the liquid cooling medium, as opposed to forced convection of liquid cooling medium, to absorb and transfer heat in the cooling hubs. The housing unit of the phase change liquid cooling medium may utilize capillary on inner wicks to drive the liquid flow and sustain the evaporation at the interface adjacent to heat spreading apparatus.

FIGS. 1A and 1B illustrate a schematic structure of the hub-link cooling system including a computer system, a SOTS heat spreading apparatus 110, cooling hubs 120 and 121, heat radiating device 150, and pump systems 153 and 154. The computer system includes multiple heat-generating components such as 131, 132, and 133. The computer printed circuit board (PCB) 130 includes computer components such as add-on cards, storage devices, and other peripheral equipment. The SOTS heat spreading apparatus 110 may be formed as a single piece, or in multiple pieces. Heat generated by the computer components while in use is transferred via the SOTS 110 to the cooling hubs 120 and 121 without interfering with the computer system. For example, micro-channels 111, 112, 113, and 114 in SOTS link nodes adjacent to component 131 to nodes adjacent to cooling hubs 120 and 121. These links will define heat flow paths when enclosed two-phase working fluid within the SOTS absorbs heat from component 131, flows to the corresponding cooling hubs 120 and 121, and dissipates to the liquid cooling medium within the cooling hubs 120 and 121. It should be appreciated that links shown in FIGS. 1A and 1B are schematically represented and the actual layout may be determined by the computer architecture to which the hub-linked cooling system is configured for. Cooling hubs house liquid cooling medium circulated in loops 151 and 152, which are driven by pumps 153 and 154 respectively. Liquid cooling medium absorbs heat transferred via connected links and then flows from the cooling hubs 120 and 121 to the heat radiating device 150, where the absorbed heat is dissipated to exterior surroundings. The cooled liquid cooling medium is driven back to cooling hubs. The loops 151 and 152, in some embodiments, are closed loops. The liquid cooling medium may be pre-charged in the loops 151 and 152 prior to implementation. In some cases, an optional reservoir may be added to the system to provide additional liquid cooling medium. The SOTS heat spreading apparatus 110 may be considered as a housing for multiple micro-channel networks with two-phase working fluid enclosed within the micro-channels. For example, as illustrated, there are four nodes including 115 and 116 located adjacent to component 131. It should be appreciated that the nodes are in the solid body of the SOTS apparatus 110, where heat generated by component 131 will conduct through the contact interface between the SOTS apparatus 110 and the component 131 first, then through the solid body of the SOTS apparatus 110, and will eventually be absorbed by the two-phase working fluid in the micro-channels. In particular, node 115 provides three connections such as through micro-channel 141 to node 122, through micro-channel 142 to node 123, and from micro-channel 143 to node 124, where nodes 122 and 123 are located adjacent to cooling hub 120, and node 124 is located adjacent to cooling hub 121. It should be appreciated that in some embodiments, there are rules for the node routing and connecting method to ensure the heat and mass flow inside the SOTS 110 is self-organized. For example, nodes adjacent to the same computer component should not be connected directly to each other and a node should not connect to the same individual node more than once. In some embodiments, each node may connect to at least two other nodes located at different zones. In FIGS. 1A and 1B, not all nodes are illustrated for the SOTS apparatus 110. As illustrated, connections ending with "x" mean that the connections to nodes are not illustrated. It should also be appreciated that at every moment, not all the links have heat flow from components to cooling hubs. Because of the closed loop nature of the micro-channels, there may always be links occupied by two-phase flow returning from nodes adjacent to cooling hub 120 back to nodes adjacent to components 131. Heat flow or return flow via the two-phase working fluid may happen in the same link at different times. That is, the two-phase working fluid may experience bidirectional flow within the micro-channels.

In some embodiments, the cooling hubs 120 may be fixed to the computer PCB 130, as shown in FIGS. 1C and 1D. With SOTS 110 as the host of heat flow links, the layout of cooling hubs 120 can be designed for the least interference to the computer components, such as a processor 160. In some embodiments, SOTS 110 can be attached to multiple computer components and made to accommodate the differences in component heights through fabrication methods, such as, for example, being punched, bent 161, single piece integration, welded/soldered 162, adhered, by using thermally conductive interface material 163, or any combination thereof. Generally, processors 160 in the system generate intensive heat and may require intimate surface contact with minimal added thermal resistance to provide efficient conductive heat transfer. Other components, such as voltage regulators 164, generate a relatively small amount of heat in comparison with processors 160 and have very large safe operating temperature margins, thus they can be attached to SOTS 110 through less precise methods, such as soldering 162, bending 161 the SOTS 110, or thermally conductive interface material 163.

In some embodiments, it is preferable to design the system such that the contact area between the SOTS 110 and the hub 120 is much larger than the contact area between the SOTS 110 and heat generating components 131, 132 and 133 (of FIG. 1A). With this general design guideline, concentrated heat at component 131, 132 and 133 can be dissipated to cooling hub 120 with reduced heat density, and the contact resistance between the SOTS 110 and the hub 120, which is inversely proportional to the contact area, can contribute much less temperature gradient to the heat flow. Furthermore, in some embodiments, the SOTS 110 and hub 120 can be merged into one piece via welding or soldering to eliminate contact resistance for improved heat transfer performance. It should be appreciated that FIGS. 1A through 1D show representative relative positions of computer system and its components, SOTS heat spreading apparatus 110, and cooling hubs 120. The actual placement and geometrical relations will vary with detail system configurations.

FIG. 2A illustrates one embodiment of a hub-link liquid cooling system configured for a dual processor computer system, such as one employing the Open Computer Project (OCP) form factor. SOTS heat spreading apparatus 210 is attached to one CPU and the corresponding voltage regulators, such as by screws 212. The SOTS 210 may be conformingly shaped to bypass memories 260 and extend to two edges of enclosure 220, where it is secured, such as with bracket 250, to self-enclosed liquid cooling hubs 240 to provide thermal contact therebetween. SOTS 210 may have various thicknesses at different locations. For example, the area 216 covering the CPU may be about 5 mm thick to maintain strength and rigidity and to promote flatness for intimate contact with the CPU, while the rest of the SOTS 210 may be on the order of 2 mm thick to have better formability and maintain low profile to accommodate the height of system components within the form factor. As shown in FIG. 2A, two independent cooling hubs 240, 248 may be placed symmetrically on two edges of enclosure 220. Liquid cooling medium flows into hub 240 via inlet port 242, circulates through the hub 240, and flows out via outlet port 244. The SOTS 210 transfers heat from the heat generating components, such as the CPU, to the cooling hubs 240, 248 simultaneously. By utilizing two independent cooling hubs, if one cooling medium loop fails, the computer components can still be cooled by the other redundant cooling loop.

With continued reference to FIG. 2A and additional reference to FIGS. 2B-2F, which illustrate an exploded view of the hub-link liquid cooling system, the SOTS 210 may be attached to cooling hubs 240, 248 through the openings on enclosure's 220 two edges. In one embodiment, cooling hubs 240, 248 are fixed on the edges of enclosure 220, where additional brackets 222 may be used to enclose cooling hubs 240 and strengthen the structural integrity of enclosure 220. The assembly may further be assembled with brackets to mount on server racks. In some embodiments, SOTS 210 has heat absorption zone 215 and heat dissipation zone 214, where the heat dissipation zone 214 is configured to have larger surface contact area with the hubs 240, 248 when compared with the contact area of the heat absorption zone 215 and the heat generating component. SOTS 210 may be a completely enclosed two-phase flow heat spreading apparatus. It can utilize discrete two-phase (liquid-vapor) flow that is housed in a node-path network of capillary channels embedded in a solid body as an energy carrier. The thermal energy absorbed at heat absorption zone 215 motivates the two-phase flow, and the topology of the node-path network utilizes the complexity of the node placements and connections to make the enclosed two-phase flow move with a global self-organized criticality, thus representing a stable and highly efficient heat transfer between the heat absorption zone 215 and heat dissipation zones 214 of SOTS 210. Bracket 250 (of FIG. 2A) can be used to ensure tight contact between heat dissipation zone 214 and cooling hub 240. Adjustment screws 254 may be used through holes 252 to pull brackets 250 against cooling hub 240, which would press heat dissipation zone 214 to cooling hub 240 for a tight attachment and surface contact therebetween. The bends and thickness of SOTS 210 allow flexibility of the heat dissipation zone 214 along the width of the system, thus allowing for fabrication and assembly tolerances.

FIGS. 2G-2I illustrate one embodiment of the cooling hub 240 such as in FIG. 2A. In one embodiment of the hub 240, a hollow body 246 may be formed by extrusion. A sample cross section of the extrusion is shown as FIG. 2I which is taken along parting line A-A from FIG. 2H. FIG. 2I is one example profile for the extrusion. End caps 245, 247, may be attached to the hollow body 246, such as by welding or adhering. End cap 245 defines an inlet port 242 and an outlet port 244. Liquid cooling medium flows in via inlet port 242, and passes toward end cap 247, and then returns back to outlet port 244. 242 and 244 can be interchangeably used as inlet or outlet during or between operations. In one embodiment, the hollow body 246 is formed by an extrusion process which is a low-cost fabrication method to create a seamless body for liquid flow. Welded end caps 245, 247 can provide strong and long-lasting permanent joints to prevent liquid leakage under pressure. In some cases, the hub 240 and its possible failure points, can be placed outside the enclosure of the computer system to prevent damage to the computer system if leakage should occur.

In some embodiments, the hollow body 246 defines one or more channels 256, or lumens, that extend through the body 246. Cooling fins 260 can be formed within the lumens 256, such as during the extrusion process, and can provide additional surface area to increase the efficiency of heat transfer from the solid body of cooing hub 240 to the cooling medium circulated within.

FIGS. 2J and 2K illustrate an optional attachment method between SOTS heat spreading apparatus 210 and cooling hub 240. Hub 240 may be fixed on the side wall 268 of the system enclosure 220. A plate bracket 260 may be fixed on the hub 240, such as with a hinge 262. A retainer 264 and its holder may be fixed to the sidewall 268 to engage with the hub 240 for mounting the hub 240 to the sidewall 268. A retainer bar 266 can be engaged with the retainer 264 to provide a biasing force that causes bracket 260 to be pressed against cooling hub 240 and additionally press the SOTS 210 tightly against the hub 240. It should be appreciated that the attachment method should not be limited to those illustrated in FIGS. 2B, 2J, and 2K, as there are other consideration factors such as contact tightness, hot-swappable components, and maintainability, among others in determining the specific method for attachment of the hub-link liquid cooling system to a specific electronic device.

Figure 3B:
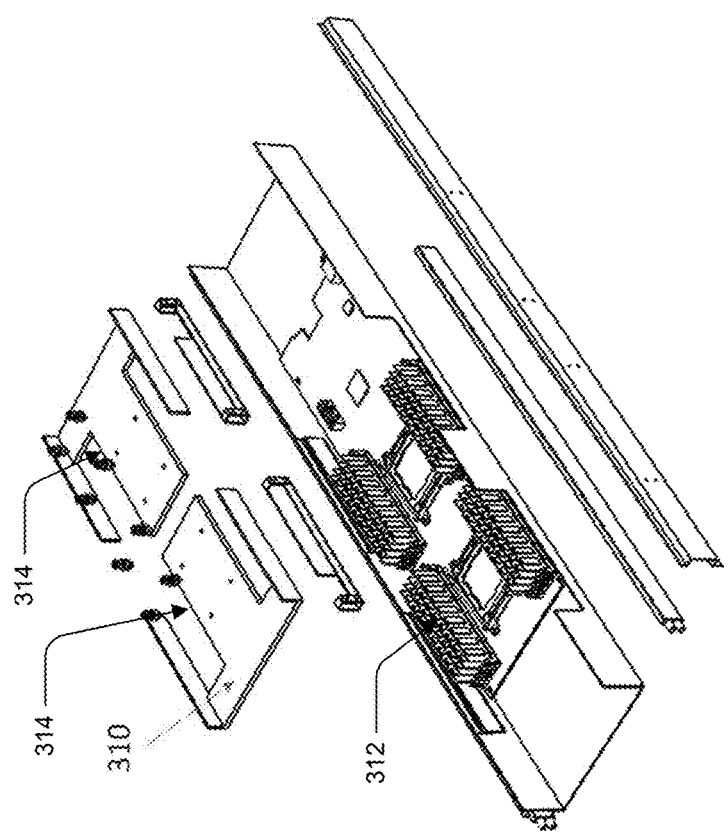
FIG. 3B is an exploded view of the hub-link liquid cooling system of FIG. 3A.
Figure 3A:
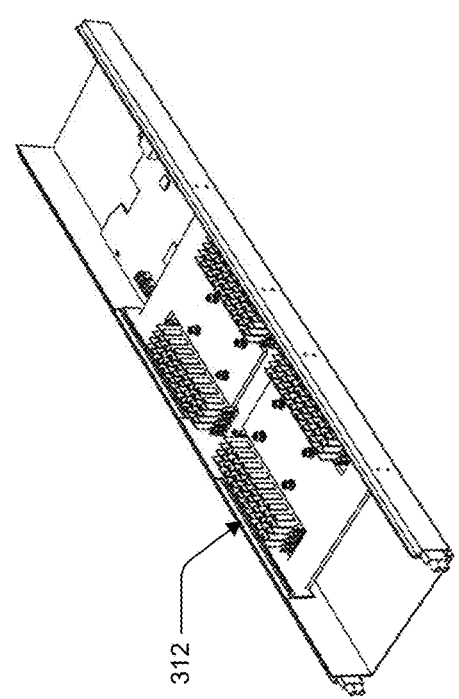
FIG. 3A is a perspective view of a hub-link liquid cooling system attached to a 1U form factor computer.

To achieve high level of serviceability for specific end-users, one embodiment for an alternative design of SOTS 310 is illustrated in FIGS. 3A and 3B. The alternative design of SOTS 310 utilizes a different 3D folding method to allow easy access to internal components, such as the memories 312. As illustrated, the SOTS 310 may have voids 314 sized and placed such that the SOTS 310 surrounds the memories 312 but allows the memories to be accessible without removing the SOTS 310. In this way, the SOTS 310 can be custom configured for a particular computer architecture to allow ease of component access, such as for replacement or service. Moreover, additional voids 314 may be configured to allow access to components other than memories 312 as desired.

With reference to FIGS. 4A and 4B, in some embodiments, the hub 412 and heat spreading apparatus 410 can be integrated into one piece, such as by direct welding or soldering. In some embodiments, the hub 412 and heat spreading apparatus 410 can even be fabricated as one piece to minimize contact thermal resistance. FIGS. 4A and 4B illustrate an example where two heat spreading units 410 are in direct contact with cooling hubs 412 and may be assembled with the computer system 414 together as one piece.

In some embodiments, an alternative cooling regime, other than convective liquid cooling, may apply to the cooling medium. FIGS. 4C and 4D illustrate an alternative design that uses phase change medium in the cooling hubs 420. Interface surface 426 is the surface where the cooling hub 420 is bonded to the heat spreading apparatus 410. Wick structure 428 is filled with liquid phase medium. Heat transferred to the hub 420 via interface surface 426 will vaporize the liquid medium in the wick and release the vapor to the top section 430 of the hub 420. Liquid phase medium 432 will be sucked into wick 428 by capillary force to refill the void due to evaporation. The vapor phase cooling medium will leave the housing via outlet port 422 and condense to a liquid phase again by a second stage heat exchanger. The condensed liquid phase medium will then be returned to the housing via inlet port 424 to form a closed loop cooling system. In some embodiments, a compression stage may be involved in this two-phase loop, where the return liquid medium will be at a lower temperature than ambient. Alternatively, the vapor phase medium can be compressed to a much higher temperature and therefore a much larger temperature gradient to ambient which allows a more compact heat exchanger to be utilized.

FIGS. 5A-5D illustrate another embodiment of the proposed system with the cooling hub 540 placed in the computer enclosure 520. The illustrated system 500 utilizes a hybrid cooling method where both air cooling and liquid cooling can be used in the system 500. Fan units 590 are positioned to cool memories 524, storage media 516, and other peripheral components posited within the airstream created by the fan units 590. SOTS 510 and cooling hub 540 are used to cool down two processors and voltage regulators. As illustrated, the cooling hub 540 may be a low-profile extruded part whose height, in some instances, is no more than 10 mm. It may be fixed to the bottom of system enclosure 520, which can be pre-installed and integrated to the enclosure, such as by welding, soldering, adhesive, screws, or other mechanical or chemical fastening methods. SOTS 510 may be configured to extend beyond the boundaries of the PCB and extend sufficiently to contact cooling hub 540. The total thickness can be controlled to one-half of an inch or less, and in some embodiments, the total thickness of the SOTS 510 and hub 540 is controlled so that when they are assembled within a system enclosure 520, they take up less than about 28% of the height of a 1U server system. There are two U-shape liquid cooling loops, one of which flows in via port 542 and leaves via port 541, and the other flows in via port 543 and leaves via 544. The multiple fluid paths ensures redundancy in the case that one of the circulation pumps experiences a catastrophic failure.

FIGS. 6A and 6B illustrate an embodiment where SOTS heat spreading apparatus 610, about the size of the PCB 630, may contact all the major heat-generating components mounted on the PCB. SOTS 610 has openings 640 and 642 sized, shaped, and located within SOTS 610 to allow memories, connectors, and some other parts to extend therethrough. The liquid cooling loop comprises a holder 620 and a fluid tube 622. The route of the liquid cooling loop is predetermined based upon the computer architecture and the layout of the electronic components on the PCB 630, and in some cases, is designed to optimize space utilization. Tube 622 may be bent into the shape of a fluid route to bypass obstacles present within the computer enclosure 650, and may be pressed into or soldered onto the holder 620 before being assembled to SOTS 610. In one exemplary embodiment, fluid tube 622 is soldered onto SOTS 610 for better heat transfer performance and structural integrity. In some applications, one PCB design could be used in various computer system configurations for different application scenarios. In some cases, the liquid loop route may change to accommodate different system mechanical structures, such as the location and layout of computer components, the size and shape of the PCB 630, and the shape of the computer housing 650, among other considerations. The shape of SOTS 610 may be based upon the design of the PCB, and may be consistent across various computer system configurations that share a common PCB. Therefore, the system 600 shown in FIGS. 6A and 6B can offer a low-cost and flexible liquid cooling solution for a variety of system configurations. While the illustrated system 600 shows only a single liquid loop in the computer system, it should be appreciated that redundant liquid loops could be deployed if necessary and/or desired with very little modification to the system. The liquid loop is not constrained to be on the top surface of SOTS 610; it could be placed along at the bottom of SOTS 610, or along any portion(s) of SOTS 610 desirable to provide heat transfer properties, as needed.

FIG. 7A illustrates a schematic drawing of a SOTS system 700 embedded in a solid body 710. Heating nodes, 720, 721 and 722, are located in the zones attached adjacent to heat-generation components attached to a PCB, where 720 and 721 belong to the same group of heating nodes. These heating nodes 720, 721 divide the zone into independent subzones to absorb heat from computer components adjacent to the nodes 720, 721. Cooling nodes 740 are located in the zones attached adjacent to the cooling source. The heating nodes and cooling nodes are connected by capillary channels 750 formed in the solid body 710. The capillary channels may be formed during manufacture of the solid body, such as by laser cutting, etching, machining, electro-discharge machining, or other suitable manufacturing techniques. FIG. 7A schematically shows the connection from node 720, 721 and 722 to corresponding cooling nodes 740. Not all the connections are illustrated in FIG. 7A.

In some embodiments, the complexity of the SOTS network may be simplified, such as where the whole network topology can be formed as a regular closed-loop Oscillating Heat Pipe (OHP), such as is shown in FIG. 7B. An OHP has a relatively high heat spreading performance and is capable of removing a higher heat fluxes when compared to standard heat pipes. OHPs are a passive heat transfer device that do not require pumps or power. The heat transfer occurs through natural oscillations of the working fluid between the evaporator (e.g., heat generating components) and condenser (e.g. cooling source). A first heating zone 760 adjacent to heating components is configured to draw heat away from the heat-generating components attached to the PCB, and a first cooling zone 770 is adjacent to the cooling sources. Capillary channels 730 are formed to create a closed-loop, which is often referred to as a flat OHP. The meandering capillary channels 730 can act as heat transport channels and may direct heat away from the first heating zone 760 and toward the first cooling zone 770 to be further dissipated to cooling medium.

As shown in FIG. 7C, in some embodiments, some zones 718 on SOTS 710 may not be available for cooling sources to be attached directly thereto. In these cases, a relatively lower cost heat transfer device, such as a heat pipe 780 can be used between the SOTS 710 and one or more remote cooling sources 770 for heat transfer. In some embodiments, even where the solid body 710 covers the surface area of the PCB, the SOTS 710 network system may only cover a limited area of the PCB, i.e. the shaded zone 712, where most of the heating components on the PCB are located. For example, a minor heat source 762 may be too far from the cooling source 772 to receive adequate cooling. Instead of developing a specialized SOTS 710 network to service the zone where the minor heat source 762 is located, a separate heat transfer device 782 can be bonded onto SOTS 710 top surface to enhance the local heat transfer. The separate heat transfer device 782 may be a typical heat pipe, an OHP, or some other form of heat transfer component to allow the minor heat source to be cooled by the cooling source 772 and the SOTS 710. In this way, a standard system 700 can be customized quickly and efficiently to accommodate a computer architecture that may deviate from a standard architecture for which a specific SOTS 710 is designed to be integrated with.

In some embodiments, as shown in FIG. 7D, a remote heat source 764, for example an add-on card, may be added to the computer system, which may need to be cooled by the main cooling sources 724 attached to the SOTS 710. In this case, an independent heat transfer device, such as a heat pipe 780, can be used to transfer heat from the first heating zone 764 to SOTS 710. In other words, SOTS 710 and its attached cooling sources 724 act as a hub of a cooling station to directly or indirectly cool the heat-generating computer components. The system 700 is therefore configurable at the point of installation to accommodate many computer architectures.

As shown in FIGS. 8A and 8B, PCB 805 and its components, which may include one or more CPUs 806 and one or more memories 807, can be positioned and oriented to be exclusively cooled by the hub-link liquid cooling systems 800 described herein. That is, the heat generated from the heat-generating components coupled to the PCB 805 is transported to the cooling hubs 820 via SOTS heat spreading apparatus, and is then dissipated to the outside by the liquid cooling medium circulating along the edges of the system enclosure through the cooling hubs 820. SOTS heat spreading apparatus 810 transfers heat from heat-generating components, such as one or more CPUs 806 to cooling hubs 820. Conduction based cooling brackets 830 may transfer heat from one or more memories 807 to cooling hubs 820. For example, cooling brackets 830 may be in contact with the one or more memories 807 to absorb heat through conduction, and then transfer the absorbed heat to the cooling hubs 820, also through conduction. This system can provide redundant cooling by implementing two or more independent liquid loops. It should be appreciated that there are variant configurations and layouts of the computer and the hub link cooling system 800 that are within the spirit and scope of this disclosure.

Figure 9:
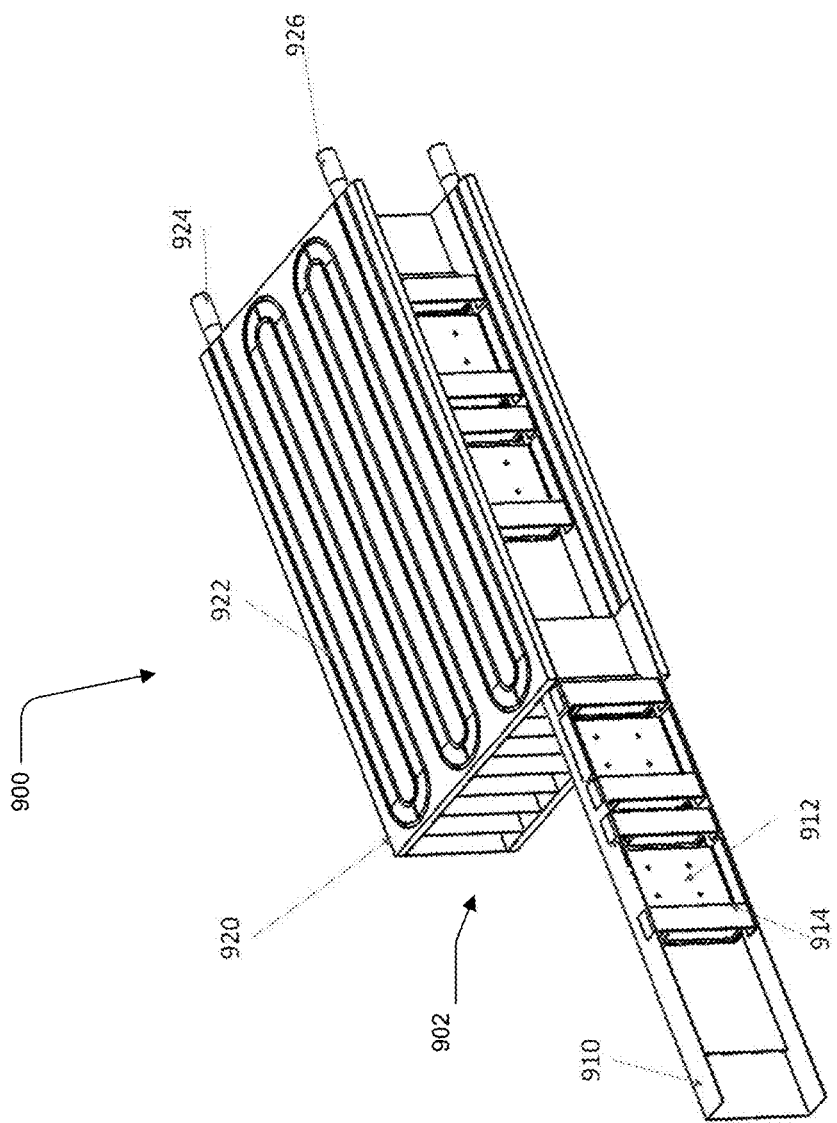
FIG. 9 is a perspective view a blade server system incorporating a single cooling hub shared by multiple computer blades.

FIG. 9 illustrates one embodiment for a hub-link cooling system 900 that may be utilized in a blade server system 902. In some cases, multiple server blades 910 are placed sideby-side vertically between two cold plates 920. Cold plates 920 serve as the cooling hub shared by the clustered server blades 910. SOTS 912 and cooling brackets 914 in this configuration may serve as heat spreading apparatuses similar to the description of SOTS 810 and cooling brackets 830 as illustrated in FIGS. 8A and 8B. That is, where heat generated by the major components of a server blade 910 is transferred through the SOTS 912 and cooling brackets 914 to the attached cold plates 920. A metal tube 922 may be embedded, affixed, attached, or adhered to the metal case of the cold plates 920. In this configuration, liquid cooling medium may be circulated through the cooling fluid path defined by metal tube 922, which may include one or more inlet ports 924 and outlet ports 926. It should be appreciated that cold plate 920 in FIG. 9 is shown as an example configuration, as there are numerous ways of configuring the cold plate to act as a cooling hub to be used in conjunction with one or more SOTS 912 and/or cooling brackets 914. By sharing cold plates 920 among multiple server blades 910, the cooling system's 900 structure is highly simplified and provides for easy maintenance.

To achieve cooling redundancy without duplicating an entire cooling system, a "share" regime may be utilized on the rack level for a clustered computer system. As shown in FIG. 10A, a rack 1010 hosts multiple server nodes 1020. The entire rack may be cooled by several parallel cooling loops 1021, 1022 (e.g. four parallel loops in FIG. 10B), and each liquid loop may pass across multiple server nodes 1020. In some cases, for each node, the components may be cooled by two parallel cooling loops 1021 and 1022, such that if one loop fails, the other loop will continue to sufficiently cool the server nodes until the failed loop is repaired. The heat generated by the rack can be dissipated to a second stage cooling loop via heat exchanger 1030 and then eventually to the exterior by cooling system 1032. Computer components in FIGS. 10A and 10B may have the same redundancy for both liquid cooling loops and pump systems.

Figure 10C:
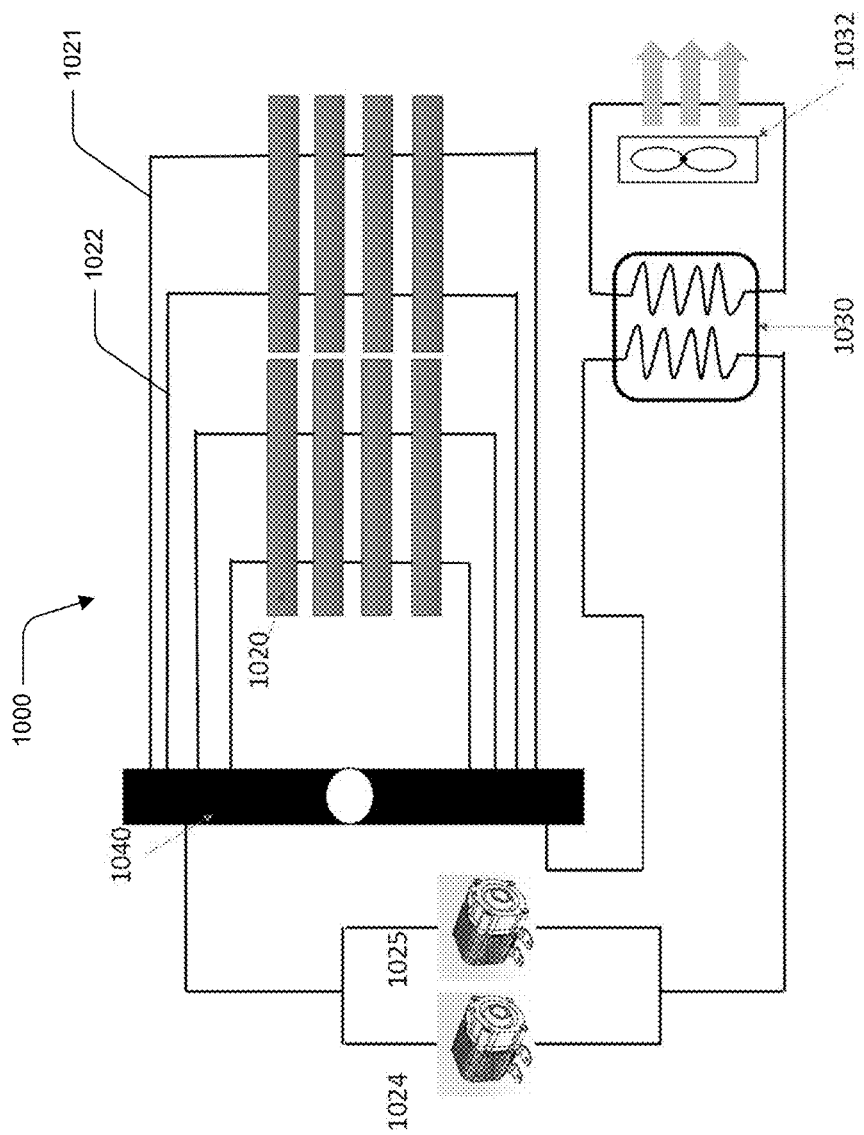
FIG. 10C is a schematic drawing of cooling and pump redundancy for a clustered computer system.

FIG. 10C illustrates another exemplary embodiment of a cooling system that can provide cooling redundancy. Liquid loops 1021 1022, which pass across computer nodes may be connected to a common manifold 1040, where liquid cooling medium is distributed and collected. The collected liquid cooling medium in the manifold 1040 can be driven by a pump 1024 and an option redundant counterpart pump 1025 to a heat exchanger 1030, where the heat collected from the server node 1020 can be transferred to the second cooling system 1032. The cooled liquid cooling medium is then sent back to manifold 1040 and redistributed to each liquid loop.

In this way, a simple cooling system is formed as a hub-link structure that is easily configurable, scalable, and provides redundant cooling of heat-generating components. Furthermore, the system provides redundancy, can be configured to provide hybrid cooling media, and is easy to maintain. Finally, the hub-link cooling system 1000 is easily configurable for many different computer architectures and can even be configured on-the-fly at the point of install through the addition of add-on hubs, heat pipes, or other heat sink type devices.

According to some embodiments, a liquid cooling system includes a first cooling hub, a heat spreading apparatus, such as SOTS, and a circulation pump. The first cooling hub may contain a first cooling medium, such as pure liquid or a two-phase fluid. The heat spreading apparatus may define a plurality of internal capillary channels, which form a closed node-path network for circulating a first two-phase working fluid. The heat spreading apparatus may be in conductive thermal communication with the first cooling hub. That is, the heat spreading apparatus may be in surface contact with the first cooling hub. Alternatively, the heat spreading apparatus may be welded, bonded, or integrally formed with the first cooling hub. The circulation is in fluid communication with the first cooling hub and is used to circulate the first cooling medium within the first cooling hub.

The cooling hub may include a first port end and a second closed end. The cooling hub may be an extruded body that defines one or more hollow channels, which may be referred to as lumens. One end of the cooling hub may be closed by an endcap that provides fluid communication between the hollow channels. The other end, or the port end, may include ports with fittings to provide an inlet and an outlet to the hollow channels within the cooling hub.

The cooling hub may have fins formed within the channels down the longitudinal length of the cooling hub. The fins may be formed during manufacture, such as during extrusion, and may provide increased heat transfer than if the fins were not incorporated into the design of the cooling hub.

The internal capillary channels within the heat spreading apparatus form a network of nodes and paths for self-organized criticality for two-phase working fluid flow therein. That is, the network of nodes and paths allows the two-phase working fluid to flow through the channels by capillary action or by a pressure differential among the SOTS nodes. In some cases, a second heat transfer device, such as a heat pipe, may also be integrated with the SOTS heat spreading apparatus as a supplemental adjustment of heat flows. This is especially useful where an electronic device has a heat-generating component that is located relatively far away from the other primary heat generating components. In this case, a heat pipe may thermally couple the remote heat generating component to the SOTS heat spreading apparatus.

In some cases, the heat spreading apparatus has a first planar surface and a second planar surface that are not co-planar. This may allow the heat spreading apparatus to contact multiple heat generating components that may extend different heights above the PCB. This may also allow the heat spreading apparatus to contact multiple heat generating components and cooling hubs perpendicular or angled to each other.

A secondary heat exchanger may be used to transfer heat from the first cooling medium within the cooling hub to an ambient environment. In some instances, this takes place outside a housing of the electronic device. When two-phase fluid is used as cooling medium for cooling hub, a condenser may be placed in communication with the cooling hub and can be used to condense the cooling medium from a vapor phase to a liquid phase.

In some cases, a second cooling hub and a second heat spreading apparatus may be used to provide redundant cooling to an electronic device. Moreover, the cooling hub can provide cooling to multiple electronic devices, such as multiple computers within a server rack.

Along with the systems described herein, a method includes providing a heat spreading apparatus in contact with one or more heat-generating components of a first electronic device. The heat spreading apparatus can contain a two-phase working fluid and the heat spreading apparatus can define internal fluid flow networks. The method further includes providing a cooling hub in surface contact with at least a portion of the heat spreading apparatus, the cooling hub containing a first cooling fluid. In use, the method includes transferring heat via two-phase fluid flow within the heat spreading apparatus to the first cooling fluid within the cooling hub, and transferring the heat to an ambient environment through a heat exchanger in thermal communication with the cooling hub.

In some instances, a second heat spreading apparatus is provided in contact with one or more heat-generating components of a second electronic device (e.g. a second computing device), where the second heat spreading apparatus can contain a second two-phase working fluid and define internal fluid flow paths. The second heat spreading apparatus can be placed in surface contact with the cooling hub; thereby configuring the cooling hub to provide thermal transfer from both the first electronic device and the second electronic device. In this way, a single cooling hub may be utilized to provide cooling benefits to multiple electronic devices.

In some instances, a second heat spreading apparatus is placed in contact with a different one of the one or more heat generating components of the first electronic device and in thermal communication with the cooling hub. That is, multiple heat generating apparatuses may be used in a single computing device and coupled to a shared cooling hub to effect the heat transfer away from the heat-generating components.

In some cases, a system includes a closed cooling fluid loop containing a first two-phase cooling fluid. The fluid loop is made up of a cooling hub defining an internal fluid pathway; a pump to circulate the first two-phase cooling fluid within the closed fluid loop; and a condenser for condensing the first two-phase cooling fluid from a vapor phase to a liquid phase. The system further includes a heat spreading apparatus containing a first two-phase working fluid and comprising a body defining a network of internal capillary channels, wherein the internal capillary channels form a closed network. The heat spreading apparatus may be in thermal contact with the cooling hub to transfer heat from the first two-phase working fluid within the heat spreading apparatus to the first two-phase cooling fluid within the cooling hub.

In some instances, a second heat spreading apparatus is placed in thermal contact with the cooling hub. That is, multiple heat spreading apparatuses can share a common cooling hub. The heat spreading apparatus may be located within a first electronic device and the second heat spreading apparatus is located within a second electronic device.

In some examples, a second heat spreading apparatus is placed in thermal contact with the cooling hub. The second heat spreading apparatus may be located within the same electronic device or a different electronic device than the first heat spreading apparatus. Optionally, a heat pipe can be placed in thermal contact with the cooling hub.

In some embodiments, the heat spreading apparatus is in thermal contact with two or more heat-generating components mounted to a printed circuit board of an electronic device. The heat spreading apparatus may define a zone of heat absorption and a second zone of heat dissipation, and the internal capillary channels can define heat and mass flow paths between these two zones and intersect at nodes located inside the zones.

The heat spreading apparatus may be configured to mount inside an electronic device and to make surface contact with one or more heat generating components attached to a printed circuit board within the electronic device.

During use, as the heat-generating components within the electronic device generate heat, the heat is transferred by conduction through the solid housing of heat spreading apparatus that is in contact with the heat-generating component and is transferred to the two-phase working fluid circulating within micro-channels within the heat spreading apparatus. Heat absorbed by two-phase working fluid may cause non-uniform temperature and pressure rise and/or random phase changes at random locations inside the heat spreading apparatus. The two-phase working fluid will be driven by the internal pressure difference and sudden volume change accompanied with the occurrence of phase change. Appropriate layout of micro-channels, connectivity topology, and type of two-phase working fluids, can have the heat and mass flow in whole to be self-organized at a critical point which provides for a highly efficient and dynamically stable heat transfer.

The two-phase working fluid, either vapor fraction or liquid fraction, transfers heat to the cooling hub by heat transfer regime stochastically varying in conduction, convection, phase change, or any combination thereof. The cooling hub, in turn, transfers the heat to another cooling medium within the cooling hub by convection (single phase cooling fluid) or phase change (two-phase cooling fluid). One or more pumps circulate the cooling medium within the cooling hub which transfers the heat in the cooling medium to a heat exchanger. In some cases, the cooling medium within the cooling hub is also a two-phase fluid that undergoes a phase change upon absorbing sufficient heat. A condenser may be provided to encourage the cooling medium to return to a liquid phase.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A liquid cooling system, comprising: a first-heat spreading apparatus having a solid body defining a node-path network that includes a plurality of nodes and a plurality of paths, wherein individual paths of the plurality of paths are internal capillary channels and individual nodes of the plurality of nodes join two or more of the internal capillary channels: a two phase working fluid contained with the node-path network of the heat spreading apparatus: a cooling hub, in conductive thermal contact with the heat spreading apparatus: a cooling medium contained within a cooling loop that extends at least partially through the cooling hub: and a circulation pump configured to circulate the cooling medium within the cooling loop: wherein the node-path network of the heat spreading apparatus has a self-organized criticality for flow of the two-phase working fluid therein.

2. The liquid cooling system of claim 1, wherein:
the cooling hub comprises a body with a closed end and a port end having a first port and a second port,
the body defines a first lumen extending through the body from the first port toward the closed end and a second lumen extending through the body from the second port toward the closed end, and
the first lumen and the second lumen are in fluid communication at the closed end.

3. The liquid cooling system of claim 2, wherein the cooling hub further comprises a plurality of fins extending longitudinally within the first lumen and the second lumen.

4. The liquid cooling system of claim 1, further comprising a separate heat transfer device integrated to the heat spreading apparatus to adjust heat flow.

5. The liquid cooling system of claim 1, wherein the heat spreading apparatus has a first planar surface and a second planar surface for transferring heat from heat sources that are not co-planar.

6. The liquid cooling system of claim 1, further comprising a secondary heat exchanger to transfer heat from the cooling medium to an ambient environment.

7. A method, comprising:
providing a heat spreading apparatus in contact with one or more heat-generating components of a first electronic device, the heat spreading apparatus containing a two-phase working fluid within a node-path network defined by a solid body of the heat spreading apparatus, wherein the node-path network includes a plurality of nodes and a plurality of paths, wherein individual paths of the plurality of paths are internal capillary channels and individual nodes of the plurality of nodes join two or more of the internal capillary channels;
providing a cooling hub in surface contact with at least a portion of the heat spreading apparatus, the cooling hub containing a cooling fluid configured to circulate through a cooling loop that extends at least partially through the cooling hub;
transferring heat from the one or more heat-generating components into the heat spreading apparatus and to the two-phase working fluid to cause heat and mass flow of the two-phase working fluid through the node-path network, the heat and mass flow of the two-phase working fluid achieving self-organized criticality;
transferring heat from the two-phase working fluid in the heat spreading apparatus to the cooling fluid within the cooling hub via conductive thermal contact between the heat spreading apparatus and the cooling hub; and
transferring the heat from the cooling fluid to an ambient environment by circulating the cooling fluid through the cooling loop from the cooling hub to a heat exchanger.

8. The method of 7, further comprising:
providing a second heat spreading apparatus in contact with one or more second heat-generating components of a second electronic device, the second heat spreading apparatus containing a second two-phase working fluid within a second node-path network; and
placing the second heat spreading apparatus in surface contact with the cooling hub, thereby configuring the cooling hub to provide thermal transfer from both the first electronic device and the second electronic device.

9. The method of claim 7, further comprising:
providing a second heat spreading apparatus in contact with one or more additional heat generating components of the first electronic device and in thermal communication with the cooling hub.

10. The method of claim 9, further comprising:
providing a second cooling hub in thermal contact with the heat spreading apparatus and the second heat spreading apparatus;
transferring heat from the heat spreading apparatus to the cooling hub and the second cooling hub; and
transferring heat from the second heat spreading apparatus to the cooling hub and the second cooling hub.

11. The method of claim 7, further comprising:
providing a second heat spreading apparatus in thermal communication with a second electronic device;
providing a second cooling hub in thermal communication with the second heating spreading apparatus to collect and transfer heat away from the second electronic device via the second heat spreading apparatus and the second cooling hub; and
providing a circulatory pump connecting the cooling hub and the second cooling hub in series.

12. The method of claim 7, further comprising:
providing a fluid manifold in fluid communication with the cooling hub;
providing a second cooling hub in fluid communication with the fluid manifold;
providing a first circulatory pump coupled to the fluid manifold;
providing a second circulatory pump coupled to the fluid manifold; and
circulating, by the first circulatory pump and the second circulatory pump, the cooling fluid through the cooling hub and the second cooling hub.

13. A system, comprising: a closed cooling loop at least partially defined by an internal fluid pathway of a cooling hub, the closed cooling loop containing a two-phase cooling fluid and comprising a condenser for condensing the two-phase cooling fluid from a vapor phase to a liquid phase; and a heat spreading apparatus containing a two-phase working fluid within a node-path network defined by a solid body of the heat spreading apparatus, wherein the node-path network includes a plurality of nodes and a plurality of paths, wherein individual paths of the plurality of paths are internal capillary channels and individual nodes of the plurality of nodes join at least two of the internal capillary channels, and wherein the heat spreading apparatus is in thermal contact with the cooling hub such that heat energy from the two-phase working fluid of the heat spreading apparatus is transferred to transfer heat to the two-phase cooling fluid of the closed cooling loop; wherein the node-path network of the heat spreading apparatus has a self-organized criticality for flow of the two-phases working fluid therein.

14. The system of claim 13, further comprising a second heat spreading apparatus in thermal contact with the cooling hub.

15. The system of as in claim 14, wherein the heat spreading apparatus is located within a first electronic device and the second heat spreading apparatus is located within a second electronic device.

16. The system of claim 13, further comprising a pump to circulate the two-phase cooling fluid within the closed cooling loop.

17. The system of claim 13, wherein the heat spreading apparatus is in thermal contact with one or more heat-generating components mounted to a printed circuit board of an electronic device.

18. The system of claim 13, wherein the heat spreading apparatus is configured to mount inside an electronic device and to make surface contact with one or more heat generating components attached to a printed circuit board within the electronic device.

19. The system of claim 13, wherein the plurality of nodes contains one or more heat absorption nodes and one or more heat dissipation nodes, the one or more heat dissipation nodes being positioned at a location of the thermal contact between the heat spreading apparatus and the cooling hub.

* * * * *